(12) United States Patent
Liu et al.

(10) Patent No.: US 11,963,378 B2
(45) Date of Patent: Apr. 16, 2024

(54) DISPLAY PANEL AND METHOD FOR MANUFACTURING THE SAME, AND DISPLAY DEVICE

(71) Applicant: KunShan Go-Visionox Opto-Electronics Co., Ltd, Jiangsu (CN)

(72) Inventors: Rusheng Liu, Kunshan (CN); Jingsong Tang, Kunshan (CN); Hongrui Li, Kunshan (CN); Rubo Xing, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 444 days.

(21) Appl. No.: 17/499,050

(22) Filed: Oct. 12, 2021

(65) Prior Publication Data
US 2022/0045299 A1 Feb. 10, 2022

Related U.S. Application Data

(63) Continuation of application No. PCT/CN2020/085131, filed on Apr. 16, 2020.

(30) Foreign Application Priority Data

Sep. 24, 2019 (CN) .......................... 201910906427.0

(51) Int. Cl.
*H10K 50/828* (2023.01)
*H10K 50/818* (2023.01)
(Continued)

(52) U.S. Cl.
CPC ......... *H10K 50/828* (2023.02); *H10K 50/818* (2023.02); *H10K 59/122* (2023.02);
(Continued)

(58) Field of Classification Search
CPC ... H10K 50/828; H10K 50/818; H10K 59/122
See application file for complete search history.

(56) References Cited

U.S. PATENT DOCUMENTS

| 9,685,485 B2* | 6/2017 | Inoue ..................... H10K 50/12 |
| 11,282,897 B2* | 3/2022 | Son ......................... H10K 50/16 |

(Continued)

FOREIGN PATENT DOCUMENTS

| CN | 104730750 A | 6/2015 |
| CN | 106816557 A | 6/2017 |

(Continued)

OTHER PUBLICATIONS

International Search Report dated Jul. 15, 2020 in corresponding International application No. PCT/CN2020/085131; 7 pages.
(Continued)

*Primary Examiner* — Mamadou L Diallo
(74) *Attorney, Agent, or Firm* — Maier & Maier, PLLC

(57) ABSTRACT

A display panel and a method for manufacturing the same, and a display device. The display panel includes a first display area and a second display area. A light transmittance of the first display area is greater than a light transmittance of the second display area, and the display panel includes: a substrate; and a light-emitting element layer including a first electrode, a light-emitting structure located on the first electrode, and a second electrode assembly located on the light-emitting structure. The second electrode assembly includes: a light-transmitting electrode, at least partially located in the first display area; a light-transmitting block located in the first display area and stacked with the light-transmitting electrode; and a second electrode located in the second display area. A material of the second electrode and a material of the light-transmitting electrode nonbind with each other.

20 Claims, 5 Drawing Sheets

(51) Int. Cl.
*H10K 59/12* (2023.01)
*H10K 59/122* (2023.01)
*H10K 59/131* (2023.01)
*H10K 59/35* (2023.01)
*H10K 59/60* (2023.01)
*H10K 71/00* (2023.01)
*H10K 102/10* (2023.01)

(52) U.S. Cl.
CPC ........ *H10K 59/131* (2023.02); *H10K 59/353* (2023.02); *H10K 59/60* (2023.02); *H10K 71/00* (2023.02); H10K 59/1201 (2023.02); H10K 2102/102 (2023.02); H10K 2102/103 (2023.02)

(56) References Cited

U.S. PATENT DOCUMENTS

| | | | | |
|---|---|---|---|---|
| 11,387,281 | B2 * | 7/2022 | Xin | H10K 59/35 |
| 11,744,121 | B2 * | 8/2023 | Hsieh | H04N 23/57 |
| 2016/0240811 | A1 | 8/2016 | Kim et al. | |
| 2016/0301921 | A1 * | 10/2016 | Zhang | H04N 13/398 |
| 2020/0035954 | A1 * | 1/2020 | Yoshida | H10K 50/856 |
| 2020/0280010 | A1 * | 9/2020 | Jiang | H10K 59/122 |
| 2020/0312237 | A1 * | 10/2020 | He | H10K 59/00 |
| 2020/0394983 | A1 * | 12/2020 | Huang | H10K 59/176 |
| 2021/0005680 | A1 * | 1/2021 | Cho | H10K 59/38 |
| 2021/0020706 | A1 * | 1/2021 | Chen | H10K 59/17 |
| 2021/0065625 | A1 * | 3/2021 | Wang | H10K 59/35 |
| 2021/0134899 | A1 * | 5/2021 | Peng | H10K 59/127 |
| 2021/0151521 | A1 * | 5/2021 | Liu | H10K 59/131 |
| 2021/0175297 | A1 * | 6/2021 | Kim | H10K 59/40 |
| 2022/0209068 | A1 * | 6/2022 | So | H10K 59/60 |

FOREIGN PATENT DOCUMENTS

| | | |
|---|---|---|
| CN | 107611280 A | 1/2018 |
| CN | 107870689 A | 4/2018 |
| CN | 108470756 A | 8/2018 |
| CN | 109801903 A | 5/2019 |
| CN | 110061038 A | 7/2019 |
| CN | 110189639 A | 8/2019 |
| CN | 110783484 A | 2/2020 |

OTHER PUBLICATIONS

First Office Action dated Jul. 16, 2020 in corresponding Chinese application No. 201910906427.0; 8 pages Including Partial English-language translation.

* cited by examiner

DISPLAY PANEL AND METHOD FOR MANUFACTURING THE SAME, AND DISPLAY DEVICE

CROSS-REFERENCE TO RELATED APPLICATION

This application is a continuation of International Application No. PCT/CN2020/085131, filed on Apr. 16, 2020, which claims priority to Chinese Patent Application No. 201910906427.0, filed on Sep. 24, 2019 and titled "DISPLAY PANEL AND METHOD FOR MANUFACTURING THE SAME, AND DISPLAY DEVICE". Both of the applications are incorporated herein by reference in their entireties.

FIELD

The present application relates to the field of display, and in particular, to a display panel and a method for manufacturing the same, and a display device.

BACKGROUND

High screen-to-body ratio is the latest development direction of a smart electronic product. In order to increase a screen-to-body ratio, various sensors on the front of an electronic product need to be integrated under a display panel. At present, devices such as a fingerprint recognition device, an earphone and so on can already be well integrated under the display panel, however, an integration problem of a front camera of the electronic product still cannot be solved well.

For an integration of the front camera, a current solution is to dig a groove or punch a hole at a position corresponding to the camera on the display panel, however, this will cause a problem that information cannot be displayed on an area of the display panel where the groove is grooved or the hole is punched.

SUMMARY

The present application provides a display panel and a method for manufacturing the same, and a display device.

In a first aspect, an embodiment of the present application provides a display panel including a first display area and a second display area, wherein a light transmittance of the first display area is greater than a light transmittance of the second display area, and the display panel includes: a substrate; and a light-emitting element layer located on the substrate and including a first electrode, a light-emitting structure located on the first electrode, and a second electrode assembly located on the light-emitting structure, wherein the second electrode assembly includes: a light-transmitting electrode, at least partially located in the first display area; a light-transmitting block located in the first display area and stacked with the light-transmitting electrode; and a second electrode located in the second display area, wherein a material of the second electrode and a material of the light-transmitting electrode nonbind with each other.

In a second aspect, an embodiment of the present application provides a display device, which includes the display panel according to the foregoing embodiment.

According to the foregoing embodiment of the second aspect of the present application, the display panel includes a first surface and a second surface opposite to each other, the first surface is a display surface, and the display device further includes: a photosensitive component located on a side of the second surface of the display panel and corresponding to the first display area in position.

In a third aspect, an embodiment of the present application provides a method for manufacturing a display panel. The display panel includes a first display area and a second display area, a light transmittance of the first display area is greater than a light transmittance of the second display area, and the method includes: providing a substrate; forming a first electrode on the substrate; forming a patterned pixel definition layer on the substrate, wherein the pixel definition layer includes a pixel opening corresponding to the first electrode and exposing at least a portion of the first electrode; forming a light-emitting structure on the first electrode; and forming a second electrode assembly on the light-emitting structure and the pixel definition layer, wherein the forming a second electrode assembly on the light-emitting structure and the pixel definition layer includes: forming a light-transmitting electrode on the light-emitting structure and the pixel definition layer, wherein the light-transmitting electrode is at least partially located in the first display area; forming a patterned light-transmitting block on the light-transmitting electrode via using a first material, wherein the light-transmitting block is located in the first display area; and evaporating a second material on a surface away from the substrate to obtain a second electrode, wherein the second material and the first material nonbind with each other so that the second electrode avoids the first display area to form a film structure.

BRIEF DESCRIPTION OF THE DRAWINGS

By reading the following detailed description of non-limiting embodiments with reference to the drawings, other features, purposes and advantages of the present application will become more apparent, wherein the same or similar reference signs indicate the same or similar features, and the drawings are not drawn according to an actual scale.

DETAILED DESCRIPTION

In a smart electronic device such as a mobile phone and tablet computer, it is necessary to integrate a photosensitive component such as a front camera, an infrared light sensor, and a proximity light sensor on a side where a display panel is set. In some embodiments, a light-transmitting display area may be arranged on the above-mentioned electronic device, and the photosensitive component may be arranged under the light-transmitting display area, therefore a full-screen display of the electronic device can be realized under the condition that the photosensitive component is guaranteed to work normally.

In an existing display panel with a light-transmitting display area, due to process limitations, the light-transmitting display area can only be arranged at an edge on one side of a non-light-transmitting display area, and it is impossible to arrange the second display area around the first display area, that is, an offshore design of the first display area cannot be realized.

In order to solve the above-mentioned problems, embodiments of the present application provide a display panel and a method for manufacturing the same, and a display device. Various embodiments of the display panel and the method for manufacturing the same, and the display device will be described below with reference to the drawings.

An embodiment of the present application provides a display panel, which may be an Organic Light Emitting Diode (OLED) display panel. Hereinafter, the display panel of the embodiment of the present application will be described in detail with reference to the drawings.

Figure 1:
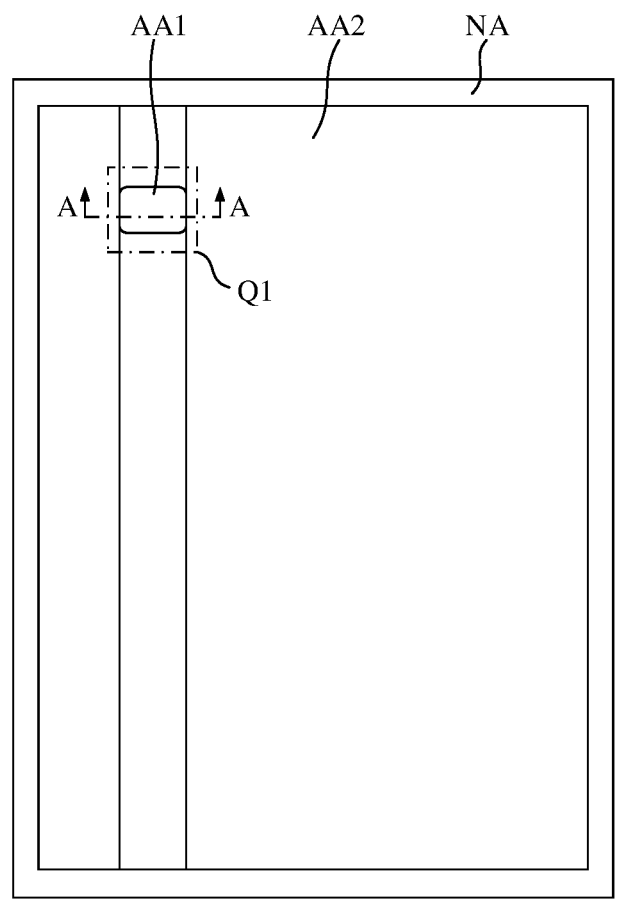
FIG. 1 is a schematic top view of a display panel provided according to an embodiment of the present application.
Figure 2:
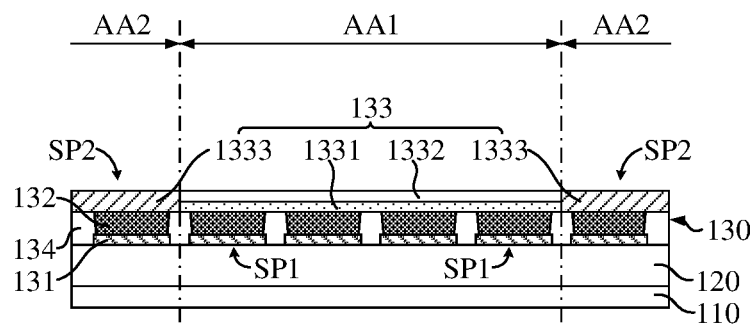
FIG. 2 is a cross-sectional view of an example in a direction of A-A in FIG. 1.

FIG. 1 is a schematic top view of a display panel provided according to an embodiment of the present application, and FIG. 2 is a cross-sectional view of an example in a direction of A-A in FIG. 1. The display panel 100 has a first display area AA1 and a second display area AA2. In some embodiments, the display panel 100 further includes a non-display area NA surrounding an outer periphery of the first display area AA1 and the second display area AA2. A light transmittance of the first display area AA1 is greater than a light transmittance of the second display area AA2.

Herein, it is preferable that the light transmittance of the first display area AA1 is greater than or equal to 15%. In order to ensure that the light transmittance of the first display area AA1 is greater than 15%, even greater than 40%, and even higher, a light transmittance of at least part of functional film layers of the display panel 100 in this embodiment is greater than 80%, and a light transmittance of at least part of functional film layers is even greater than 90%.

For the display panel 100 according to the embodiment of the present application, the light transmittance of the first display area AA1 is greater than the light transmittance of the second display area AA2, so that the display panel 100 can integrate a photosensitive component on the back of the first display area AA1 to realize, for example, an under-screen integration of a photosensitive component of a camera, while the first display area AA1 can display an image, which increases a display area of the display panel 100 and realizes a full-screen design of the display device.

The display panel 100 includes a substrate 110 and a light-emitting element layer 130 located on the substrate 110. Optionally, the display panel 100 further includes a device layer 120, the device layer 120 is located on the substrate 110, and the light-emitting element layer 130 is located on the device layer 120.

The substrate 110 may be made of a light-transmitting material such as glass or polyimide (PI). The device layer 120 may include a pixel circuit for driving display of each sub-pixel, and the device layer 120 may be configured as a transparent layer structure. The light-emitting element layer 130 is used to form a plurality of light-emitting elements.

Optionally, the display panel 100 may also include an encapsulation layer and a polarizer and a cover plate located above the encapsulation layer. The cover plate may also be directly arranged above the encapsulation layer without arranging a polarizer, or the cover plate is at least directly arranged above the encapsulation layer of the first display area AA1 without arranging a polarizer, to prevent the polarizer from affecting a light collection amount of a photosensitive element arranged under the corresponding first display area AA1. Of course, a polarizer can also be arranged above the encapsulation layer of the first display area AA1.

The light-emitting element layer 130 includes a first electrode 131, a light-emitting structure 132 located on the first electrode 131, and a second electrode assembly 133 located on the light-emitting structure 132. One of the first electrode 131 and the second electrode assembly 133 is an anode, and the other is a cathode. In this embodiment, an example, where the first electrode 131 is an anode and the second electrode assembly 133 is a cathode, is taken to make description. In the first display area AA1, each first electrode 131 and a corresponding light-emitting structure 132 and the second electrode assembly 133 in an area corresponding to the light-emitting structure 132 form a first sub-pixel SP1, and the first sub-pixel SP1 is, for example, an OLED light-emitting element. In the second display area AA2, each first electrode 131 and a corresponding light-emitting structure 132 and the second electrode assembly 133 in an area corresponding to the light-emitting structure 132 form a second sub-pixel SP2, and the second sub-pixel SP2 is, for example, an OLED light-emitting element.

Optionally, the second electrode assembly 133 includes a light-transmitting electrode 1331, a light-transmitting block 1332, and a second electrode 1333. The light-transmitting electrode 1331 is at least partially located in the first display area AA1. The light-transmitting block 1332 is located in the first display area AA1, and the light-transmitting block 1332 is stacked with the light-transmitting electrode 1331. The second electrode 1333 is located in the second display area AA2, wherein a material of the second electrode 1333 and a material of the light-transmitting electrode 1331 nonbind with each other.

Herein, if two materials nonbind with each other, it means molecules of the two materials nonbind with each other. In the embodiment of the present application, if a first material and a second material in the two materials nonbind with each other, it means that, under the condition that the second material is evaporated on a surface of the first material, the second material does not spread on the first material.

For the display panel 100 according to the embodiment of the present application, the second electrode assembly 133 includes the light-transmitting electrode 1331 and the light-transmitting block 1332 stacked in the first display area AA1, so that a light transmittance of the second electrode assembly 133 in the first display area AA1 is greatly improved, thereby realizing a high light transmittance of the first display area AA1. The material of the second electrode 1333 and a material of the light-transmitting block 1332 nonbind with each other, which prevents the second electrode 1333 from forming a film in an area having the light-transmitting block 1332, so as to accurately realize patterning of the second electrode 1333 and prevent the second electrode 1333 from being formed in the first display area AA1 and thus affecting the light transmittance of the first display area AA1.

The display panel 100 according to the embodiment of the present application uses an alienation of materials to accurately realize patterning of the second electrode 1333, which makes a patterning design of the second electrode 1333 more diverse, and thus locates the first display area AA1 and the second display area AA2 more flexibly. The first display area AA1 can be arranged at an edge on one side of the second display area AA2, and the second display area AA2 can also be arranged around the first display area AA1 to realize an offshore design of the first display area AA1.

Optionally, the light-emitting structure 132 includes an OLED light-emitting layer. According to a design requirement of the light-emitting structure 132, it may further include at least one of a hole injection layer, a hole transport layer, an electron injection layer, or an electron transport layer.

Optionally, the first electrode 131 includes a light-transmitting conductive layer, so that the first electrode 131 is capable of transmitting light. The light-transmitting conductive layer may be Indium Tin Oxide (ITO), indium zinc oxide, or the like. Optionally, the first electrode 131 is a reflective electrode, and includes a first light-transmitting conductive layer, a first reflective layer located on the first light-transmitting conductive layer, and a second light-transmitting conductive layer located on the first reflective layer. The first light-transmitting conductive layer and the second light-transmitting conductive layer may be ITO, indium zinc oxide, or the like, and the first reflective layer may be a metal layer, for example, made of a silver material.

Optionally, a (visible light) light transmittance of the light-transmitting electrode 1331 is 90% or more, and the material of the light-transmitting electrode 1331 includes at least one of ITO, indium zinc oxide, or magnesium-silver alloy. Optionally, the light-transmitting electrode 1331 is ITO.

Optionally, a (visible light) light transmittance of the light-transmitting block 1332 is 90% or more. Preferably, the light transmittance of the light-transmitting block 1332 is 94% or more. More preferably, the light transmittance of the light-transmitting block 1332 is 96% or more. By increasing the light transmittance of the light-transmitting block 1332, a high light-transmitting performance of the first display area AA1 is realized. The material of the light-transmitting block 1332 is, for example, an organic material such as Conductor Patterning Materials (CPM), and the light-transmitting block 1332 can be formed by evaporation with a Fine Metal Mask (FMM). Optionally, a thickness of the light-transmitting block 1332 is 50 nanometers to 300 nanometers, preferably the thickness is 80 nanometers to 130 nanometers, for example, 100 nanometers.

Optionally, the material of the second electrode 1333 may be a metalloid material such as Conductor Electrode Materials (CEM) or the like, for example, magnesium-silver alloy. A film-forming property of CEM is that CEM cannot form a film on CPM, and electrical characteristics and optical characteristics of CEM are similar to those of a conventional cathode. Optionally, a thickness of the second electrode 1333 is 5 nanometers to 20 nanometers, preferably the thickness is 10 nanometers to 16 nanometers, for example, 13 nanometers.

In the display panel 100 of an example shown in FIG. 2, the light-transmitting electrode 1331 extends in the first display area AA1, and the light-transmitting electrode 1331 is not arranged in the second display area AA2. In the above structure, a stacked structure of the light-transmitting electrode 1331 and the light-transmitting block 1332 serves as a cathode of the first display area AA1, and the second electrode 1333 serves as a cathode of the second display area AA2. Optionally, the light-transmitting electrode 1331 may also be located in the first display area AA1 and the second display area AA2 at the same time.

Figure 3:
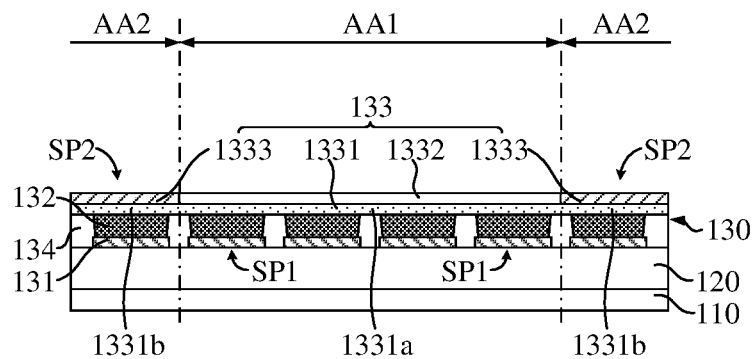
FIG. 3 is a cross-sectional view of another example in the direction of A-A in FIG. 1.

FIG. 3 is a cross-sectional view of another example in the direction of A-A in FIG. 1. In the display panel 100 of another example shown in FIG. 3, the light-transmitting electrode 1331 is also located in the second display area AA2 in addition to being located in the first display area AA1. The light-transmitting electrode 1331 includes a first light-transmitting electrode sub-layer 1331a located in the first display area AA1 and a second light-transmitting electrode sub-layer 1331b located in the second display area AA2. The light-transmitting block 1332 is arranged on the first light-transmitting electrode sub-layer 1331a, and the second electrode 1333 is arranged on the second light-transmitting electrode sub-layer 1331b. Optionally, the light-transmitting electrode 1331 is, for example, thinned magnesium-silver alloy.

In the above structure, a stacked structure of the first light-transmitting electrode sub-layer 1331a and the light-transmitting block 1332 serves as the cathode of the first display area AA1, and a stacked structure of the second light-transmitting electrode sub-layer 1331b and the second electrode 1333 serves as the cathode of the second display area AA2.

Figure 4:
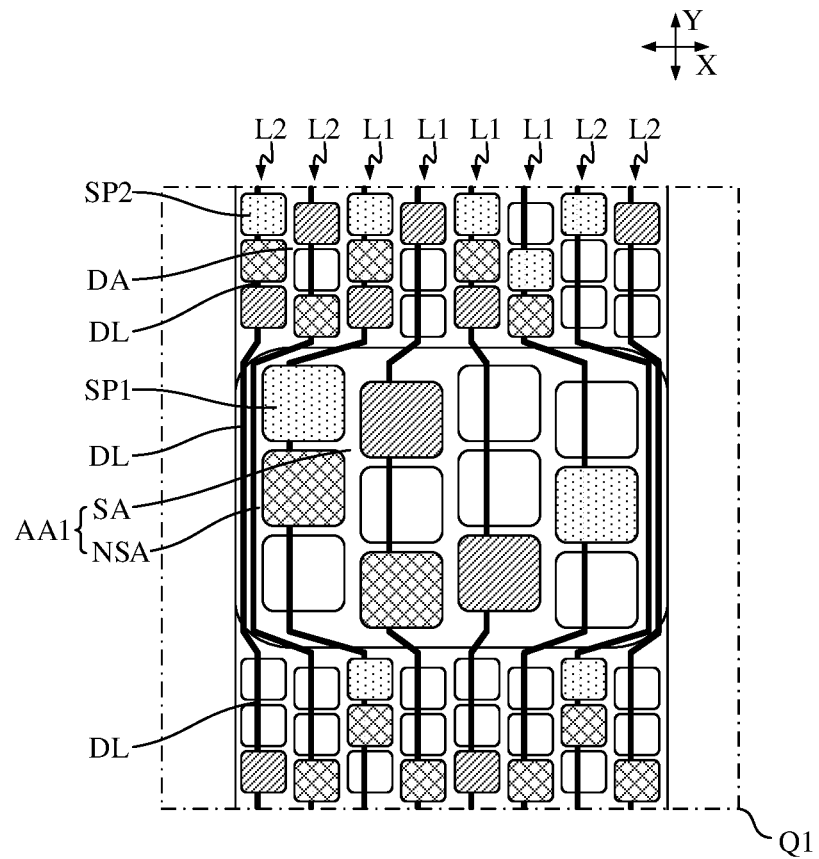
FIG. 4 is a partial enlarged schematic diagram of an example of Q1 area in FIG. 1.

FIG. 4 is a partial enlarged schematic diagram of an example of Q1 area in FIG. 1. The display panel 100 includes a plurality of first sub-pixels SP1 located in the first display area AA1 and a plurality of second sub-pixels SP2 located in the second display area AA2.

In some embodiments, the first sub-pixels SP1 are arranged in a plurality of columns along a first direction X, wherein each column of the first sub-pixels SP1 includes a plurality of the first sub-pixels SP1 extending along a second direction Y. In some embodiments, the second sub-pixels SP2 are arranged in a plurality of columns along the first direction X, wherein each column of the second sub-pixels SP2 includes a plurality of the second sub-pixels SP2 extending along the second direction Y.

The second direction Y intersects with the first direction X, and the second direction Y is, for example, perpendicular to the first direction X.

The second display area AA2 includes a data common area DA corresponding to the first display area AA1 in position in the first direction X and having a same width with the first display area AA1, and a data line DL of each column of the first sub-pixels SP1 is connected to a data line DL of one column of the second sub-pixels SP2 in the data common area DA.

Optionally, a pixel density of the second display area AA2 is greater than a pixel density of the first display area AA1. As shown in FIG. 4, the number of columns of the second sub-pixel SP2 in the data common area DA is greater than the number of columns of the first sub-pixel SP1 in the first display area AA1.

The first display area AA1 includes a pixel area SA arranged with first sub-pixels SP1 and a non-pixel area NSA located on both sides of the pixel area SA along the first direction X.

The plurality of columns of the second sub-pixels SP2 in the data common area DA are divided into a plurality of connection columns L1 and a plurality of bypass columns L2 located on both sides of the connection columns L1 along the first direction X. The number of columns of the connection columns L1 is equal to the number of columns of the plurality of columns of the first sub-pixels SP1 in the first display area AA1, and data lines DL of the connection columns L1 are connected to data lines DL of the plurality of columns of the first sub-pixels SP1 in a one-to-one correspondence. Data lines DL of the bypass columns L2 extend through the non-pixel area NSA to bypass the first sub-pixels SP1 in the pixel area SA. Each data line DL in the first display area AA1 can be connected to a corresponding data line DL in the second display area AA2, thereby optimizing a wiring structure of the data lines DL in the first display area AA1, and providing a driving basis for realizing the offshore design of the first display area AA1.

Figure 5:
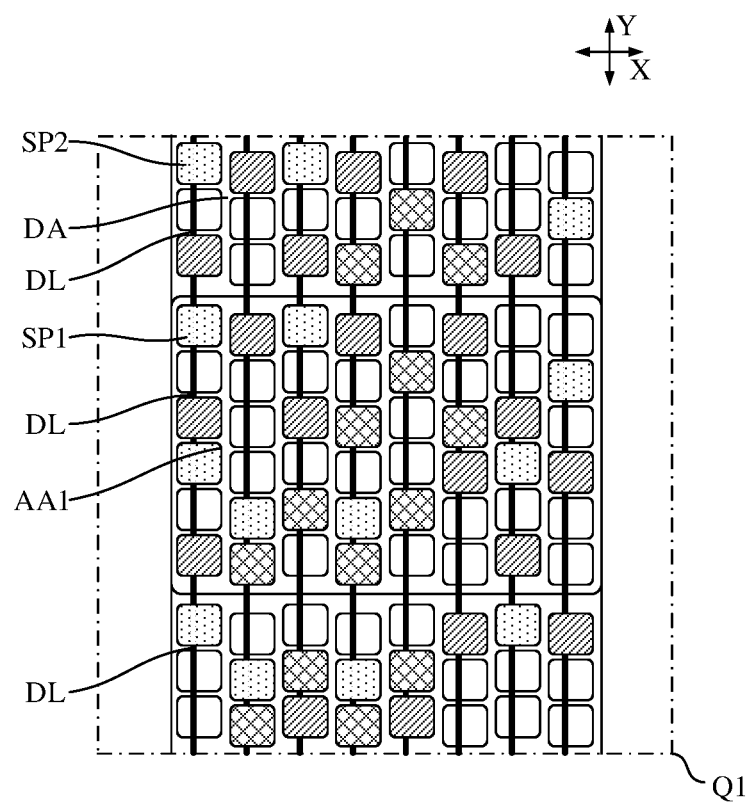
FIG. 5 is a partial enlarged schematic diagram of another example of the Q1 area in FIG. 1.

FIG. 5 is a partial enlarged schematic diagram of another example of the Q1 area in FIG. 1. The display panel 100 includes first sub-pixels SP1 located in the first display area AA1 and second sub-pixels SP2 located in the second display area AA2.

A difference from the previous example is that in the display panel of another example shown in FIG. 5, the pixel density of the second display area AA2 is equal to the pixel density of the first display area AA1. As shown in FIG. 5, the number of columns of the second sub-pixel SP2 in the data common area DA is equal to the number of columns of the first sub-pixel SP1 in the first display area AA1. Data lines DL of the plurality of columns of the second sub-pixels SP2 are connected to data lines DL of the plurality of columns of the first sub-pixels SP1 in a one-to-one correspondence, so that the data lines DL in the first display area AA1 and the data lines DL in the second display area AA2 are connected correspondingly, thereby optimizing a wiring structure of the data lines DL in the first display area AA1, and providing a driving basis for realizing the offshore design of the first display area AA1.

An embodiment of the present application also provides a method for manufacturing a display panel. The manufacturing method will be described below by taking a process of manufacturing the display panel 100 of the above-mentioned embodiment as an example.

Figure 6:
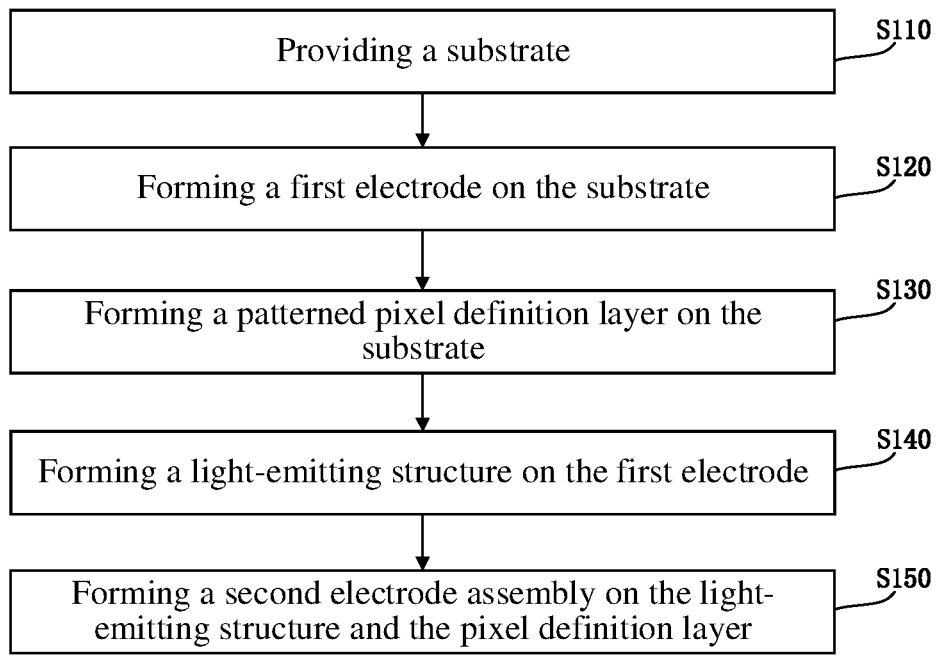
FIG. 6 is a flowchart of a method for manufacturing a display panel provided according to an embodiment of the present application.

FIG. 6 is a flowchart of a method for manufacturing a display panel provided according to an embodiment of the present application. The display panel has a first display area and a second display area, and a light transmittance of the first display area is greater than a light transmittance of the second display area. The manufacturing method includes steps S110 to S140.

In step S110, a substrate is provided. Optionally, the substrate is a substrate formed with a device layer.

In step S120, a first electrode is formed on the substrate. Optionally, the first electrode is formed on the device layer. The first electrode may be a light-transmitting electrode, such as ITO, indium zinc oxide, etc., or may be an electrode including a reflective layer which may be a metal layer, for example, made of a silver material.

In step S130, a patterned pixel definition layer is formed on the substrate, wherein the pixel definition layer includes a pixel opening corresponding to the first electrode and exposing at least a portion of the first electrode. Optionally, the pixel definition layer is also formed on the device layer.

In step S140, a light-emitting structure is formed on the first electrode. The light-emitting structure includes an OLED light-emitting layer, and according to a design requirement of the light-emitting structure, it may further include at least one of a hole injection layer, a hole transport layer, an electron injection layer, or an electron transport layer.

In step S150, a second electrode assembly is formed on the light-emitting structure and the pixel definition layer.

Figure 7:
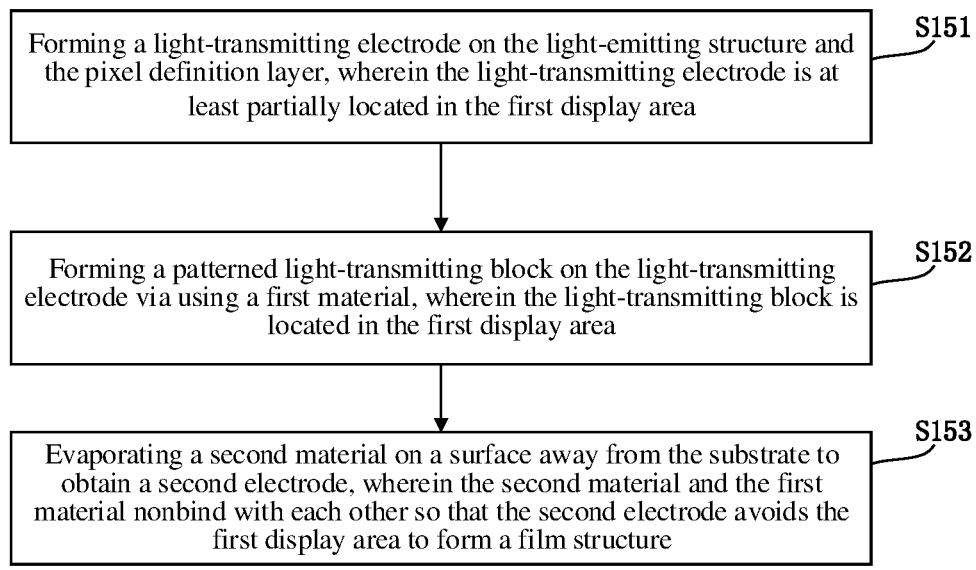
FIG. 7 is a flowchart of forming a second electrode assembly in a method for manufacturing a display panel provided according to an embodiment of the present application.

FIG. 7 is a flowchart of forming a second electrode assembly in a method for manufacturing a display panel provided according to an embodiment of the present application. Optionally, step S150 includes step S151 to step S153.

In step S151, a light-transmitting electrode is formed on the light-emitting structure and the pixel definition layer, and the light-transmitting electrode is at least partially located in the first display area AA1. A (visible light) light transmittance of the light-transmitting electrode is 90% or more, and a material of the light-transmitting electrode includes at least one of ITO, indium zinc oxide, or magnesium-silver alloy, for example, a thinned magnesium-silver alloy layer.

Optionally, in step S151, the light-transmitting electrode is only located in the first display area. Optionally, step S151 includes forming the light-transmitting electrode that extends simultaneously in both the first display area and the second display area.

In step S152, a first material is used to form a patterned light-transmitting block on the light-transmitting electrode, wherein the light-transmitting block is located in the first display area. A (visible light) light transmittance of the light-transmitting block is 90% or more. The first material is, for example, an organic material such as Conductor Patterning Materials (CPM), and the light-transmitting block can be formed by evaporation with a Fine Metal Mask (FMM). Optionally, a thickness of the light-transmitting block is 50 nanometers to 300 nanometers, preferably the thickness is 80 nanometers to 130 nanometers, for example, 100 nanometers.

In step S153, a second material is evaporated on a surface away from the substrate to obtain a second electrode. The second material and the first material nonbind with each other so that the second electrode avoids the first display area to form a film structure. The second material may be a metalloid material such as Conductor Electrode Materials (CEM) or the like, for example, magnesium-silver alloy. A film-forming property of CEM is that CEM cannot form a film on CPM, and electrical characteristics and optical characteristics of CEM are similar to those of a conventional cathode. Optionally, a thickness of the second electrode is 5 nanometers to 20 nanometers, preferably the thickness is 10 nanometers to 16 nanometers, for example, 13 nanometers The method for manufacturing a display panel according to the embodiment of the present application uses an alienation of the material of the second electrode and the material of the light-transmitting block to prevent the second electrode from forming a film in an area having the light-transmitting block, so as to accurately realize patterning of the second electrode and prevent the second electrode from being formed in the first display area and thus affecting the light transmittance of the first display area.

In addition, using an alienation of materials to accurately realize patterning of the second electrode makes a patterning design of the second electrode more diverse, and thus makes a relative position of the first display area and the second display area more flexible. The first display area can be arranged at an edge on one side of the second display area, and the second display area can also be arranged around the first display area to realize the offshore design of the first display area.

Embodiments of the present application also provide a display device, which may include the display panel 100 of any one of the foregoing embodiments. A display device of one embodiment will be taken as an example for description below. In this embodiment, the display device includes the display panel 100 of the above-mentioned embodiment.

Figure 8:
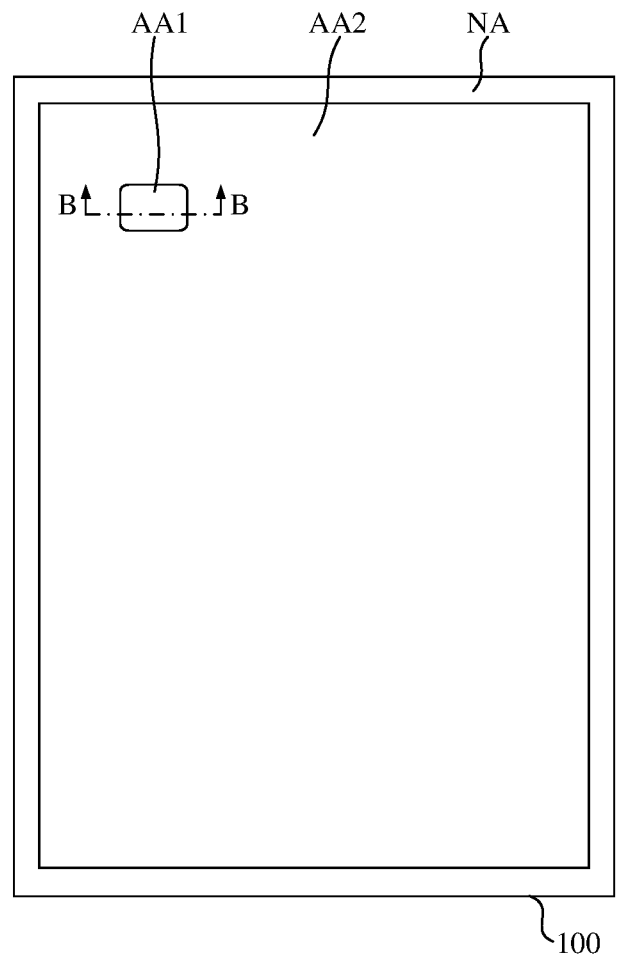
FIG. 8 is a schematic top view of a display device according to an embodiment of the present application.
Figure 9:
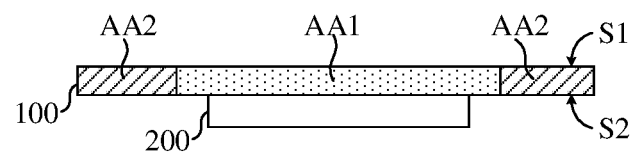
FIG. 9 is a cross-sectional view in a direction of B-B in FIG. 8.

FIG. 8 is a schematic top view of a display device provided according to an embodiment of the present application, and FIG. 9 is a cross-sectional view in a direction of B-B in FIG. 8. In the display device of this embodiment, the display panel 100 may be the display panel 100 of one of the above embodiments. The display panel 100 has a first display area AA1 and a second display area AA2 in a plane parallel to the substrate. A light transmittance of the first display area AA1 is greater than a light transmittance of the second display area AA2.

The display panel 100 includes a first surface S1 and a second surface S2 opposite to each other, wherein the first surface S1 is a display surface. The display device further includes a photosensitive component 200 located on a side of the second surface S2 of the display panel 100, and the photosensitive component 200 corresponds to the first display area AA1 in position.

The photosensitive component 200 may be an image capturing device for capturing external image information. Optionally, the photosensitive component 200 is a Complementary Metal Oxide Semiconductor (CMOS) image capturing device. Optionally, the photosensitive component 200 may also be other forms of image capturing devices such as a Charge-coupled Device (CCD) image capturing device, etc. It can be understood that the photosensitive component 200 may not be limited to an image capturing device. For example, the photosensitive component 200 may also be a light sensor such as an infrared sensor or a proximity sensor.

For the display panel according to the embodiment of the present application, the light transmittance of the first display area AA1 is greater than the light transmittance of the second display area AA2, so that the display panel 100 can integrate a photosensitive component 200 on the back of the first display area AA1 to realize, for example, an under-screen integration of the photosensitive component 200 of the image capturing device, while the first display area AA1 can display an image, which increases a display area of the display panel 100 and realizes a full-screen design of the display device.

A second electrode assembly of the display panel 100 includes a light-transmitting electrode, a light-transmitting block, and a second electrode. The light-transmitting electrode is at least partially located in the first display area. The light-transmitting block is located in the first display area, and the light-transmitting block is stacked with the light-transmitting electrode. The second electrode is located in the second display area, and a material of the second electrode and a material of the light-transmitting electrode nonbind with each other. The material of the second electrode and a material of the light-transmitting block nonbind with each other, which prevents the second electrode from forming a film in an area having the light-transmitting block, so as to accurately realize patterning of the second electrode and prevent the second electrode from being formed in the first display area and thus affecting the light transmittance of the first display area.

For the display device according to the embodiment of the present application, its display panel 100 uses an alienation of materials to accurately realize patterning of the second electrode, which makes a patterning design of the second electrode more diverse, and thus makes a relative position of the first display area AA1 and the second display area AA2 more flexible. The first display area AA1 can be arranged at an edge on one side of the second display area AA2, and the second display area AA2 can also be arranged around the first display area AA1 to realize the offshore design of the first display area AA1.

What is claimed is:

1. A display panel, comprising a first display area and a second display area, wherein a light transmittance of the first display area is greater than a light transmittance of the second display area, and the display panel comprises:

a substrate; and
a light-emitting element layer located on the substrate and comprising a first electrode, a light-emitting structure located on the first electrode, and a second electrode assembly located on the light-emitting structure,
wherein the second electrode assembly comprises:
a light-transmitting electrode, at least partially located in the first display area;
a light-transmitting block located in the first display area and stacked with the light-transmitting electrode; and
a second electrode located in the second display area, wherein a material of the second electrode and a material of the light-transmitting electrode nonbind with each other.

2. The display panel of claim 1, wherein the light-transmitting electrode is located in the second display area and comprises a first light-transmitting electrode sub-layer located in the first display area and a second light-transmitting electrode sub-layer located in the second display area, the light-transmitting block is arranged on the first light-transmitting electrode sub-layer, and the second electrode is arranged on the second light-transmitting electrode sub-layer.

3. The display panel of claim 1, wherein a light transmittance of the light-transmitting electrode is 90% or more and the material of the light-transmitting electrode comprises at least one of indium tin oxide, indium zinc oxide, or magnesium-silver alloy.

4. The display panel of claim 1, wherein a light transmittance of the light-transmitting block is 90% or more and a thickness of the light-transmitting block is 50 nanometers to 300 nanometers.

5. The display panel of claim 4, wherein the light transmittance of the light-transmitting block is 96% or more and the thickness of the light-transmitting block is 80 nanometers to 130 nanometers.

6. The display panel of claim 1, wherein a thickness of the second electrode is 5 nanometers to 20 nanometers.

7. The display panel of claim 6, wherein the thickness of the second electrode is 10 nm to 16 nm.

8. The display panel of claim 1, wherein the first electrode is a reflective electrode.

9. The display panel of claim 1, further comprises a plurality of first sub-pixels located in the first display area and a plurality of second sub-pixels located in the second display area,
the first sub-pixels are arranged in a plurality of columns along a first direction, wherein each column of the first sub-pixels comprises a plurality of the first sub-pixels extending along a second direction,
the second sub-pixels are arranged in a plurality of columns along the first direction, wherein each column of the second sub-pixels comprises a plurality of the second sub-pixels extending along the second direction, and
the second direction intersects with the first direction.

10. The display panel of claim 9, wherein the second display area comprises a data common area corresponding to the first display area in position in the first direction and having a same width with the first display area, and a data line of each column of the first sub-pixels is connected to a data line of one column of the second sub-pixels in the data common area.

11. The display panel of claim 10, wherein the number of columns of the second sub-pixels in the data common area is greater than the number of columns of the first sub-pixels in the first display area.

12. The display panel of claim 11, wherein the plurality of columns of the second sub-pixels in the data common area are divided into a plurality of connection columns and a plurality of bypass columns located on both sides of the connection columns along the first direction, wherein the number of columns of the connection columns is equal to the number of columns of the plurality of columns of the first sub-pixels in the first display area, data lines of the connection columns are connected to data lines of the plurality of columns of the first sub-pixels in a one-to-one correspondence.

13. The display panel of claim 12, wherein the first display area comprises a pixel area arranged with the first sub-pixels and a non-pixel area located on both sides of the pixel area along the first direction and data lines of the bypass columns extend through the non-pixel area to bypass the first sub-pixels in the pixel area.

14. The display panel according to claim 10, wherein the number of columns of the second sub-pixels in the data common area is equal to the number of columns of the first sub-pixels in the first display area, and data lines of the plurality of columns of the second sub-pixels are connected to data lines of the plurality of columns of the first sub-pixels in a one-to-one correspondence.

15. The display panel of claim 1, wherein the light transmittance of the first display area is greater than or equal to 15%.

16. A display device comprising the display panel of claim 1.

17. The display device of claim 16, wherein the display panel comprises a first surface and a second surface opposite to each other, the first surface is a display surface, and the display device further comprises:
 a photosensitive component located on a side of the second surface of the display panel and corresponding to the first display area in position.

18. A method for manufacturing a display panel of claim 1, comprising:
 providing a substrate;
 forming a first electrode on the substrate;
 forming a patterned pixel definition layer on the substrate, wherein the pixel definition layer comprises a pixel opening corresponding to the first electrode and exposing at least a portion of the first electrode;
 forming a light-emitting structure on the first electrode; and
 forming a second electrode assembly on the light-emitting structure and the pixel definition layer.

19. The method of claim 18, wherein the forming a second electrode assembly on the light-emitting structure and the pixel definition layer comprises:
 forming a light-transmitting electrode on the light-emitting structure and the pixel definition layer, wherein the light-transmitting electrode is at least partially located in the first display area;
 forming a patterned light-transmitting block on the light-transmitting electrode via using a first material, wherein the light-transmitting block is located in the first display area; and
 evaporating a second material on a surface away from the substrate to obtain a second electrode, wherein the second material and the first material nonbind with each other so that the second electrode avoids the first display area to form a film structure.

20. The method of claim 19, wherein the forming a light-transmitting electrode on the light-emitting structure and the pixel definition layer comprises forming the light-transmitting electrode that extends simultaneously in both the first display area and the second display area.

* * * * *